(12) United States Patent
He (10) Patent No.: US 9,640,147 B2
(45) Date of Patent: May 2, 2017

(54) DRIVING CIRCUIT FOR DISPLAY PANEL AND DRIVING METHOD THEREOF

(71) Applicant: SHENZHEN CHINA STAR OPTOELECTRONICS TECHNOLOGY CO., LTD., Shenzhen, Guangdong (CN)

(72) Inventor: Xiaoxiang He, Guangdong (CN)

(73) Assignee: SHENZHEN CHINA STAR OPTOELECTRONICS TECHNOLOGY CO., LTD., Shenzhen, Guangdong (CN)

(*) Notice: Subject to any disclaimer, the term of this patent is extended or adjusted under 35 U.S.C. 154(b) by 512 days.

(21) Appl. No.: 14/380,530

(22) PCT Filed: May 16, 2014

(86) PCT No.: PCT/CN2014/077662
§ 371 (c)(1),
(2) Date: Aug. 22, 2014

(87) PCT Pub. No.: WO2015/161536
PCT Pub. Date: Oct. 29, 2015

(65) Prior Publication Data
US 2015/0332656 A1 Nov. 19, 2015

(30) Foreign Application Priority Data
Apr. 22, 2014 (CN) .......................... 2014 1 0161763

(51) Int. Cl.
*G09G 5/18* (2006.01)
*H05B 37/00* (2006.01)
(Continued)

(52) U.S. Cl.
CPC ................. *G09G 5/18* (2013.01); *G09G 3/20* (2013.01); *G09G 3/3266* (2013.01); *G09G 3/3674* (2013.01); *G11C 19/184* (2013.01); *G11C 19/28* (2013.01); *H05B 33/086* (2013.01); *H05B 37/00* (2013.01); *G09G 2300/0426* (2013.01);
(Continued)

(58) Field of Classification Search
CPC ............... H01L 29/786; H01L 27/3248; H01L 27/3262; G09G 3/3233; G09G 3/3696
See application file for complete search history.

(56) References Cited

U.S. PATENT DOCUMENTS

2005/0140596 A1* 6/2005 Lee ....................... G09G 3/3233
345/76
2007/0046588 A1* 3/2007 Tsai ..................... G09G 3/3241
345/76

(Continued)

*Primary Examiner* — Douglas W Owens
*Assistant Examiner* — Laura Yesildag
(74) *Attorney, Agent, or Firm* — Ladas & Parry LLP (57) ABSTRACT

A driving circuit of a display panel and driving method thereof are provided. The driving circuit of the display panel has a capacitor, a first, second, third, fourth, fifth, and sixth thin film transistor, a reset thin film transistor, and an output thin film transistor. A sixth and seventh drain electrode, and an eighth gate electrode are connected to a signal output line, a sixth source electrode is configured to receive a fourth power source signal, an eighth is configured to receive a fifth power source signal, and an eighth drain electrode is connected to a sixth gate electrode.

7 Claims, 6 Drawing Sheets

(51) Int. Cl.
  *G09G 3/20* (2006.01)
  *G09G 3/3266* (2016.01)
  *G09G 3/36* (2006.01)
  *G11C 19/18* (2006.01)
  *G11C 19/28* (2006.01)
  *H05B 33/08* (2006.01)

(52) U.S. Cl.
  CPC .......... *G09G 2310/0267* (2013.01); *G09G 2310/0286* (2013.01); *G09G 2310/08* (2013.01)

(56) References Cited

U.S. PATENT DOCUMENTS

| | | | |
|---|---|---|---|
| 2008/0012844 A1* | 1/2008 | Wang | G02F 1/136204 345/212 |
| 2008/0204615 A1* | 8/2008 | Shin | G02F 1/136213 349/38 |
| 2014/0191937 A1* | 7/2014 | Xu | G09G 3/3648 345/99 |

* cited by examiner

DRIVING CIRCUIT FOR DISPLAY PANEL AND DRIVING METHOD THEREOF

FIELD OF THE INVENTION

The present invention relates to the technical field of display panels, and more particularly to a driving circuit of a display panel and a driving method thereof.

BACKGROUND OF THE INVENTION

Traditional display panels generally adopt the narrow bezel technology.

Traditional narrow bezels generally adopt the Multilayer Metal Traces or the Gate electrode driver On Array (GOA) technology. However the multilayer metal traces are not suited for applying to a narrow bezel and a circuit of the panel is probably shorted, so that the yield declines and the costs of the component rise. The GOA can be suited for applying to a narrow bezel and the cost of the Gate electrode IC can be reduced.

Currently, the traditional GOA circuit comprises a input unit, an output unit, a reset unit and a keeping unit, and a width-to-length ratio of the thin film transistor (TFT) is large in the output unit, e.g. 180 u/5 u, 1 u=1 micron. A width-to-length (W/L) ratio of the thin film transistor (TFT) is less in the reset unit, e.g. 30 u/5 u.

However, there are some problems existing in the actual use of the structure of the traditional technology, as follows:

The leakage current of the TFT is increased by adding the width-to-length ratio, so the width-to-length ratio of the TFT of the reset unit can't be too large. The pull of the reset unit is less than the push of the output unit in the GOA circuit, so that the time delay of the output signal is increased. Currently, we don't have any technology for integrating the TFT of the output unit and the TFT of the reset unit, so that the width-to-length ratio of the TFT of the reset unit needs to be increased, the leakage current of the TFT of the reset unit and the area of the GOA circuit are increased, and a time delay of a reset portion of the output signal is also increased.

At the output period of the output signal, the TFT of the reset unit is turned off. There are inevitably parasitic capacitances (Cgs/Cgd) in the TFT. The output signal is outputted from the drain electrode of the TFT of the reset unit, and a mutation of the output signal is inevitably coupled the gate electrode of the TFT of the reset unit through the Cgs/Cgd, so that the TFT of the reset unit can't be turned off stably, and little of the voltage of the output signal is lost.

Therefore, it is necessary to provide another technical solution, in order to solve the problems of the prior art.

SUMMARY OF THE INVENTION

An object of the present invention is to provide a driving circuit of a display panel and a driving method thereof, which prevents the signal output line from the electric leakage, so that the signal output line can stably output signals.

To achieve the above object, the present invention provides a technical solution as follows:

A driving circuit of a display panel comprises: a capacitor comprising a first electrode plate and a second electrode plate, wherein the second electrode plate is connected to a signal output line; a first thin film transistor comprising a first gate electrode, a first source electrode, and a first drain electrode, wherein the first gate electrode is connected to the first source electrode, and the first gate electrode and the first source electrode are configured to receive a first control signal from a first signal source; a second thin film transistor comprising a second gate electrode, a second source electrode, and a second drain electrode, wherein the first drain electrode is connected to the second source electrode, and the second drain electrode is connected to the first electrode plate of the capacitor, and the second gate electrode is configured to receive a second control signal from a second signal source; a third thin film transistor comprising a third gate electrode, a third source electrode, and a third drain electrode, wherein the third gate electrode is connected to the first drain electrode, and the third drain electrode is configured to receive a first power source signal; a fourth thin film transistor comprising a fourth gate electrode, a fourth source electrode, and a fourth drain electrode, wherein the fourth gate electrode is connected to the third drain electrode, the fourth source electrode is configured to receive a second power source signal, and the fourth drain electrode is connected to the second drain electrode; a fifth thin film transistor comprising a fifth gate electrode, a fifth source electrode, and a fifth drain electrode, wherein the fifth gate electrode is configured to receive a third control signal from a third signal source, the fifth drain electrode is connected to the third drain electrode, and the fifth source electrode is configured to receive a third power source signal; a reset thin film transistor comprising a sixth gate electrode, a sixth source electrode, and a sixth drain electrode, wherein the sixth gate electrode is connected to the fifth drain electrode, the sixth drain electrode is connected to the signal output line, and the sixth source electrode is configured to receive a fourth power source signal; an output thin film transistor comprising a seventh gate electrode, a seventh source electrode, and a seventh drain electrode, wherein the seventh source electrode is configured receive a fourth control signal from a fourth signal source, the seven gate electrode is connected to the second drain electrode, and the seventh drain electrode is connected to the signal output line; a sixth thin film transistor comprising an eighth gate electrode, an eighth source electrode, and an eighth drain electrode, wherein the eighth gate electrode is connected to the signal output line, the eighth source electrode is configured receive a fifth power source signal, and the eighth drain electrode is connected to the sixth gate electrode; and a seventh thin film transistor comprising a ninth gate electrode, a ninth source electrode, and a ninth drain electrode, wherein the ninth gate electrode is configured receive a fifth control signal from a fifth signal source, the ninth source electrode is configured to receive the second power source signal, and the ninth drain electrode is connected to the fourth source electrode; wherein the output thin film transistor comprises a first width-to-length ratio, and the reset thin film transistor comprises a second width-to-length ratio, and the first width-to-length ratio is greater than the second width-to-length ratio.

In above driving circuit of the display panel, the sixth thin film transistor is configured to receive a first signal of the signal output line and turned on during a first time period according to the first signal, so that the fifth power source signal is transmitted to the sixth gate electrode through the eighth source electrode and the eighth drain electrode for turning off the reset thin film transistor during the first time period; the reset thin film transistor is turned off during the first time period according to the fifth power source signal.

In above driving circuit of the display panel, the seventh thin film transistor is turned off during a second time period to prevent transmitting the third power source signal to the fourth source electrode through the ninth source electrode and the ninth drain electrode.

In above driving circuit of the display panel, the seventh thin film transistor is turned off during a second time period to prevent transmitting the third power source signal to the fourth source electrode through the ninth source electrode and the ninth drain electrode.

In above driving circuit of the display panel, the seventh thin film transistor and fourth thin film transistor work during the second time period to prevent resetting the second signal of a connected line between the fourth drain electrode and the second drain electrode.

In above driving circuit of the display panel, the output thin film transistor is turned on during the second time period, and the output thin film transistor and the reset thin film transistor reset the first signal of the signal output line.

In above driving circuit of the display panel, the first time period corresponds to a signal output period of the signal output line, the first time period is adjacent to the second time period, and the first time period is prior to the second time period.

In above driving circuit of the display panel, the first control signal is a scanning signal that the current row of pixels corresponds to the prior row of pixels.

A driving circuit of a display panel comprising: a capacitor comprising a first electrode plate and a second electrode plate, wherein the second electrode plate is connected to a signal output line; a first thin film transistor comprising a first gate electrode, a first source electrode, and a first drain electrode, wherein the first gate electrode is connected to the first source electrode, and the first gate electrode and the first source electrode are configured to receive a first control signal from a first signal source; a second thin film transistor comprising a second gate electrode, a second source electrode, and a second drain electrode, wherein the first drain electrode is connected to the second source electrode, the second drain electrode is connected to the first electrode plate of the capacitor, and the second gate electrode is configured to receive a second control signal from a second signal source; a third thin film transistor comprising a third gate electrode, a third source electrode, and a third drain electrode, wherein the third gate electrode is connected to the first drain electrode, and the third drain electrode is configured to receive a first power source signal; a fourth thin film transistor comprising a fourth gate electrode, a fourth source electrode, and a fourth drain electrode, wherein the fourth gate electrode is connected to the third drain electrode, the fourth source electrode is configured to receive a second power source signal, and the fourth drain electrode is connected to the second drain electrode; a fifth thin film transistor comprising a fifth gate electrode, a fifth source electrode, and a fifth drain electrode, wherein the fifth gate electrode is configured to receive a third control signal from a third signal source, the fifth drain electrode is connected to the third drain electrode, and the fifth source electrode is configured to receive a third power source signal; a reset thin film transistor comprising a sixth gate electrode, a sixth source electrode, and a sixth drain electrode, wherein the sixth gate electrode is connected to the fifth drain electrode, the sixth drain electrode is connected to the signal output line, and the sixth source electrode is configured to receive a fourth power source signal; an output thin film transistor comprising a seventh gate electrode, a seventh source electrode, and a seventh drain electrode, wherein the seventh source electrode is configured to receive a fourth control signal from a fourth signal source, the seven gate electrode is connected to the second drain electrode, and the seventh drain electrode is connected to the signal output line; and a sixth thin film transistor comprising an eighth gate electrode, an eighth source electrode, and an eighth drain electrode, wherein the eighth gate electrode is connected to the signal output line, the eighth source electrode is configured to receive a fifth power source signal, and the eighth drain electrode is connected to the sixth gate electrode.

In above driving circuit of the display panel, the output thin film transistor comprises a first width-to-length ratio, the reset thin film transistor comprises a second width-to-length ratio, and the first width-to-length ratio is greater than the second width-to-length ratio.

In above driving circuit of the display panel, the sixth thin film transistor is configured to receive a first signal of the signal output line and turned on during a first time period according to the first signal, so that the fifth power source signal is transmitted to the sixth gate electrode through the eighth source electrode and the eighth drain electrode for turning off the reset thin film transistor during the first time period. The reset thin film transistor is turned off during the first time period according to the fifth power source signal.

In above driving circuit of the display panel, the driving circuit of the display panel further comprises: a seventh thin film transistor comprising a ninth gate electrode, a ninth source electrode, and a ninth drain electrode, wherein the ninth gate electrode is configured to receive a fifth control signal from a fifth signal source, the ninth source electrode is configured to receive the second power source signal, and the ninth drain electrode is connected to the fourth source electrode.

In above driving circuit of the display panel, the seventh thin film transistor is turned off during a second time period to prevent transmitting the third power source signal to the fourth source electrode through the ninth source electrode and the ninth drain electrode.

In above driving circuit of the display panel, the seventh thin film transistor and fourth thin film transistor work during the second time period to prevent resetting the second signal of a connected line between the fourth drain electrode and the second drain electrode.

In above driving circuit of the display panel, the seventh thin film transistor and fourth thin film transistor work during the second time period to prevent resetting the second signal of a connected line between the fourth drain electrode and the second drain electrode.

In above driving circuit of the display panel, the output thin film transistor is turned on during the second time period, and the output thin film transistor and the reset thin film transistor reset the first signal of the signal output line.

In above driving circuit of the display panel, the first time period corresponds to a signal output period of the signal output line, and the first time period is adjacent to the second time period, and the first time period is prior to the second time period.

In above driving circuit of the display panel, the first control signal is a scanning signal so that the current row of pixels corresponds to the prior row of pixels.

A driving method for the driving circuit of the display panel, the method comprises the steps of: receiving a first signal of the signal output line by the sixth thin film transistor and turning on the sixth thin film transistor during a first time period according to the first signal, and transmitting the fifth power source signal to the sixth gate electrode through the eighth source electrode and the eighth drain electrode for turning off the reset thin film transistor during the first time period; and turning off the reset thin film transistor during the first time period according to the fifth power source signal.

In above driving method, the driving method further comprises the steps of: turning off the seventh thin film transistor during a second time period to prevent transmitting the third power source signal to the fourth source electrode through the ninth source electrode and the ninth drain electrode; and working the seventh thin film transistor and fourth thin film transistor during the second time period to prevent resetting the second signal of a connected line between the fourth drain electrode and the second drain electrode.

In above driving method, the driving method further comprises the steps of: turning on the output thin film transistor during the second time period, and resetting the first signal of the signal output line by the output thin film transistor and the reset thin film transistor.

Compared to the prior art, the present invention can prevent the signal output line from draining and prevent the connected line from draining between the fourth drain electrode and the second drain electrode, so that the signal output line can stably output the output signal. In addition, the time delay of the output signal from the signal output line can be reduced.

The above-mentioned content of the present invention can be best understood by referring to the following detailed description of the preferred embodiments and the accompanying drawings.

DETAILED DESCRIPTION OF THE PREFERRED EMBODIMENTS

The structure and the technical means adopted by the present invention to achieve the above and other objects can be best understood by referring to the following detailed description of the preferred embodiments and the accompanying drawings. Furthermore, directional terms described by the present invention, such as upper, lower, front, back, left, right, inner, outer, side, longitudinal/vertical, transverse/horizontal, etc., are only directions by referring to the accompanying drawings, and thus the used directional terms are used to describe and understand the present invention, but the present invention is not limited thereto.

Figure 1:
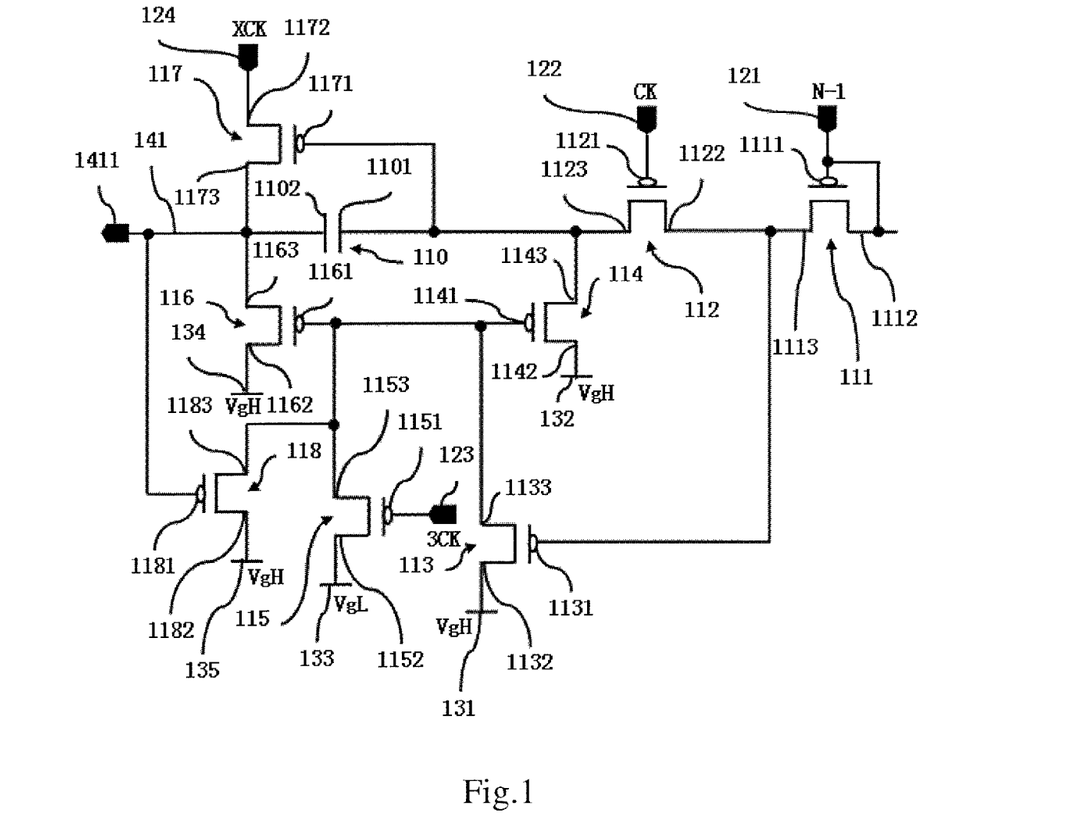
FIG. 1 is a view of a driving circuit of a display panel according to a first embodiment of the present invention.

FIG. 1 is a view of a driving circuit of the display panel according to a first embodiment of the present invention.

The driving circuit of the display panel of the embodiment comprises a capacitor 110, a signal output line 141, a first thin film transistor 111, a second thin film transistor 112, a third thin film transistor 113, a fourth thin film transistor 114, a fifth thin film transistor 115, a reset thin film transistor 116, an output thin film transistor 117, and a sixth thin film transistor 118.

In the embodiment, the first thin film transistor 111, the thin film transistor 112, the third thin film transistor 113, the fourth thin film transistor 114, the fifth thin film transistor 115, the reset thin film transistor 116, the output thin film transistor 117, and the sixth thin film transistor 118 are not only P-type thin film transistors, but also N-type thin film transistors.

The capacitor 110 comprises a first electrode plate 1101 and a second electrode plate 1102, wherein the second electrode plate 1102 is connected to a signal output line 141, and a signal output terminal 1411 of the signal output line 141 is configured to output the related signals.

The first thin film transistor 111 comprises a first gate electrode 1111, a first source electrode 1112, and a first drain electrode 1113, wherein the first gate electrode 1111 is connected to the first source electrode 1112, and the first gate electrode 1111 and the first source electrode 1112 are configured to receive a first control signal N−1 from a first signal source 121. The first thin film transistor 111 is a first switch. The turning on or off of the first thin film transistor 111 corresponds to the turning on or off of a first current path between the first source electrode 1112 and the first drain electrode 1113. In the embodiment, each output of the rows of the driving circuit is the input of the next row of the driving circuit, and each input of the rows of the driving circuit is the output of the prior row of the driving circuit. Wherein the first control signal N−1 can be the scanning signal of the prior row of pixels corresponding to the current row of pixels, and the output of the prior row of pixels is the input of the current row of pixels. For Nth row of pixels, the first control signal N−1 is the scanning signal of the N−1th row of pixels, and N is a positive integer.

The second thin film transistor 112 comprises a second gate electrode 1121, a second source electrode 1122, and a second drain electrode 1123, wherein the first drain electrode 1113 is connected to the second source electrode 1122, and the second drain electrode 1123 is connected to the first electrode plate 1101 of the capacitor 110, and the second gate electrode 1121 is configured to receive a second control signal CK from a second signal source 122. The second thin film transistor 112 is a second switch. The turning on or off of the second thin film transistor 112 corresponds to the turning on or off of a second current path between the second source electrode 1122 and the second drain electrode 1123.

The third thin film transistor 113 comprises a third gate electrode 1131, a third source electrode 1132, and a third drain electrode 1133, wherein the third gate electrode 1131 is connected to the first drain electrode 1113, and the third drain electrode 1132 is configured to receive a first power source signal from a first power source terminal 131. The third thin film transistor 113 is a third switch. The turning on or off of the third thin film transistor 113 corresponds to the turning on or off of a third current path between the third source electrode 1132 and the third drain electrode 1133.

The fourth thin film transistor 114 comprises a fourth gate electrode 1141, a fourth source electrode 1142, and a fourth drain electrode 1143, wherein the fourth gate electrode 1141 is connected to the third drain electrode 1133, the fourth source electrode 1142 is configured to receive a second power source signal from a second power source terminal 132, and the fourth drain electrode 1143 is connected to the second drain electrode 1123. The fourth thin film transistor 114 is a fourth switch. The turning on or off of the fourth thin film transistor 114 corresponds to the turning on or off of a fourth current path between the fourth source electrode 1142 and the fourth drain electrode 1143.

The fifth thin film transistor 115 comprises a fifth gate electrode 1151, a fifth source electrode 1152, and a fifth drain electrode 1153, wherein the fifth gate electrode 1151 is configured to receive a third control signal 3CK from a third signal source 123, the fifth drain electrode 1153 is connected to the third drain electrode 1133, and the fifth source electrode 1152 is configured to receive a third power source signal from a third power source terminal 133. The fifth thin film transistor 115 is a fifth switch. The turning on or off of the fifth thin film transistor 115 corresponds to the turning on or off of a fifth current path between the fifth source electrode 1152 and the fifth drain electrode 1153.

The reset thin film transistor 116 comprises a sixth gate electrode 1161, a sixth source electrode 1162, and a sixth drain electrode 1163, wherein the sixth gate electrode 1161 is connected to the fifth drain electrode 1153, the sixth drain electrode 1163 is connected to the signal output line 141, and the sixth source electrode 1162 is configured to receive a fourth power source signal from a fourth power source terminal 134. The reset thin film transistor 116 is a sixth switch. The turning on or off of the reset thin film transistor 116 corresponds to the turning on or off of a sixth current path between the sixth source electrode 1162 and the sixth drain electrode 1163.

The output thin film transistor 117 comprises a seventh gate electrode 1171, a seventh source electrode 1172, and a seventh drain electrode 1173, wherein the seventh source electrode 1172 is configured receive a fourth control signal XCK from a fourth signal source 124, the seven gate electrode 1171 is connected to the second drain electrode 1123, and the seventh drain electrode 1173 is connected to the signal output line 141. The output thin film transistor 117 is a sixth switch. The turning on or off of the output thin film transistor 117 corresponds to the turning on or off of a seventh current path between the seventh source electrode 1172 and the seventh drain electrode 1173.

The sixth thin film transistor 118 comprises an eighth gate electrode 1181, an eighth source electrode 1182, and an eighth drain electrode 1183, wherein the eighth gate electrode 1181 is connected to the signal output line 141, the eighth source electrode 1182 is configured receive a fifth power source signal from a fifth power source terminal 135, and the eighth drain electrode 1183 is connected to the sixth gate electrode 1161. The sixth thin film transistor 118 is an eighth switch. The turning on or off of the sixth thin film transistor 118 corresponds to the turning on or off of an eighth current path between the eighth source electrode 1182 and the eighth drain electrode 1183.

In the embodiment, the output thin film transistor 117 comprises a first width-to-length (W/L) ratio, the reset thin film transistor comprises 116 a second width-to-length ratio, and the first width-to-length ratio is greater than the second width-to-length ratio. For example, the first width-to-length ratio is 180 micron/5 micron, and the second width-to-length ratio is 10 micron/5 micron.

Figure 3:
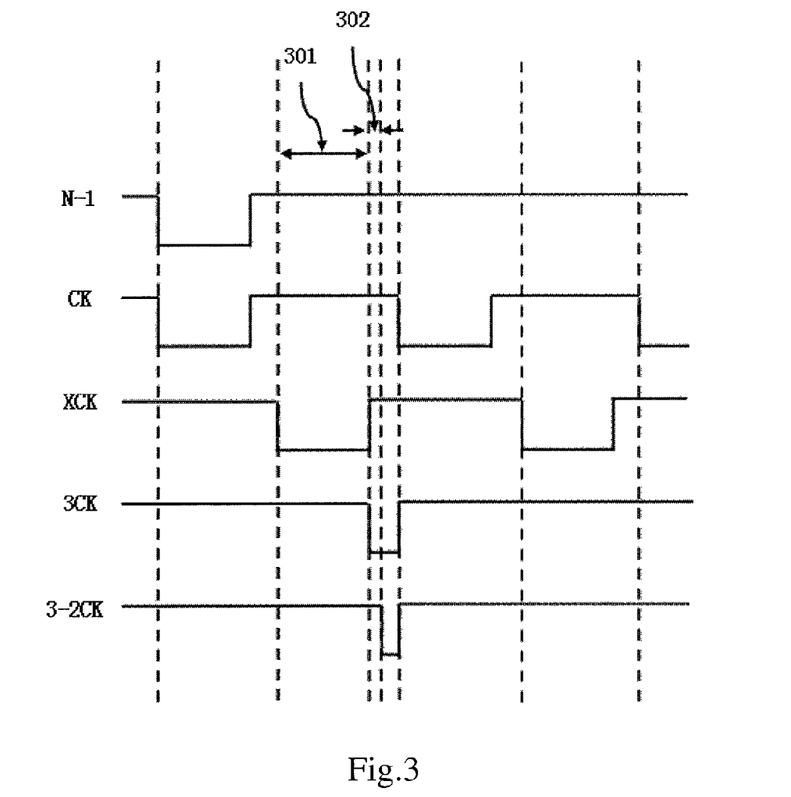
FIG. 3 is a timing diagram of the driving circuit of the display panel of FIG. 1 and FIG. 2.

Referring to FIG. 3, in the embodiment, the sixth thin film transistor 118 is configured to receive a first signal and turned on during the first time period 301 according to the first signal, so that the fifth power source signal is transmitted to the sixth gate electrode 1161 through the eighth source electrode 1182 and the eighth drain electrode 1183 for turning off the reset thin film transistor 116 during the first time period 301. The reset thin film transistor 116 is turned off during the first time period 301 according to the fifth power source signal, and the first time period 301 corresponds to a signal output period of the signal output line When the first thin film transistor 111, the thin film transistor 112, the third thin film transistor 113, the fourth thin film transistor 114, the fifth thin film transistor 115, the reset thin film transistor 116, the output thin film transistor 117, and the sixth thin film transistor 118 are P-type thin film transistors in the first time period 301, and the first control signal N−1 is a high level signal, the second control signal CK is a high level signal, the third control signal 3CK is a high level signal, the fourth control signal XCK is a low level signal, and the fifth control signal 3-2CK is a high level signal. The second control signal CK, the third control signal 3CK, the fourth control signal XCK, and the fifth control signal 3-2CK are clock signals.

When the first thin film transistor 111, the thin film transistor 112, the third thin film transistor 113, the fourth thin film transistor 114, the fifth thin film transistor 115, the reset thin film transistor 116, the output thin film transistor 117, and the sixth thin film transistor 118 are N-type thin film transistors in the first time period 301, the first control signal N−1 is a low level signal, the second control signal CK is a low level signal, the third control signal 3CK is a low level signal, the fourth control signal XCK is a high level signal, and the fifth control signal 3-2CK is a low level signal.

In the embodiment, the output signal of the signal line triggers the sixth thin film transistor 118 to be turned off during the first time period 301 (the signal output period of the signal output line), so that the fifth power source signal is outputted to the sixth gate electrode 1161, and the reset thin film transistor 116 is turned off during the first time period 301 to prevent the signal output line from draining. This also prevents the connected line between the fourth drain electrode and the second drain electrode from draining, and the signal output line 141 can stably output the output signal. In addition, the time delay of the output signal from the signal output line 141 can be reduced.

Figure 4:
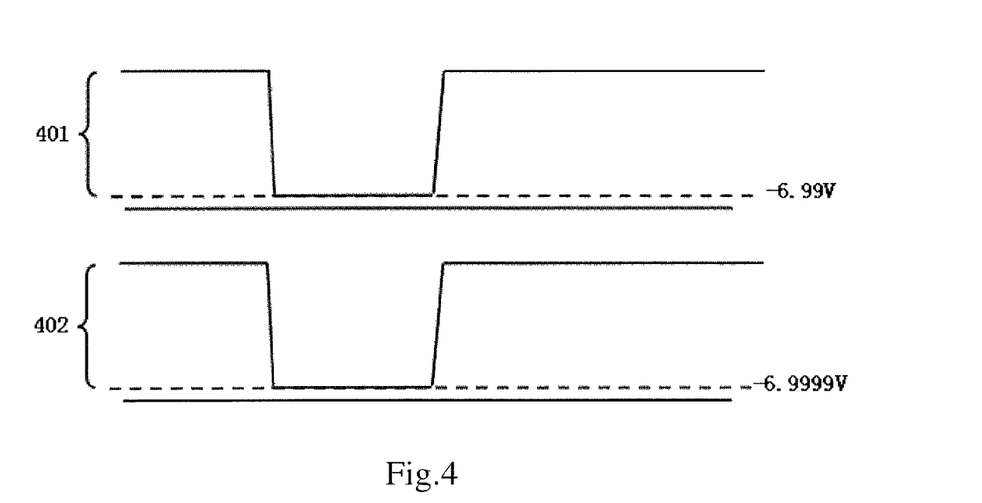
FIG. 4 is a view of the actual voltage of the output signal.

If the target output signal of the signal output line 141 is −7V (volts), the output signal 401 is −6.99V before improving, and the output signal 402 is −6.9999V after improving. Therefore, the output signal of the signal output line 141 according to above technical solutions is closer to the target.

Figure 2:
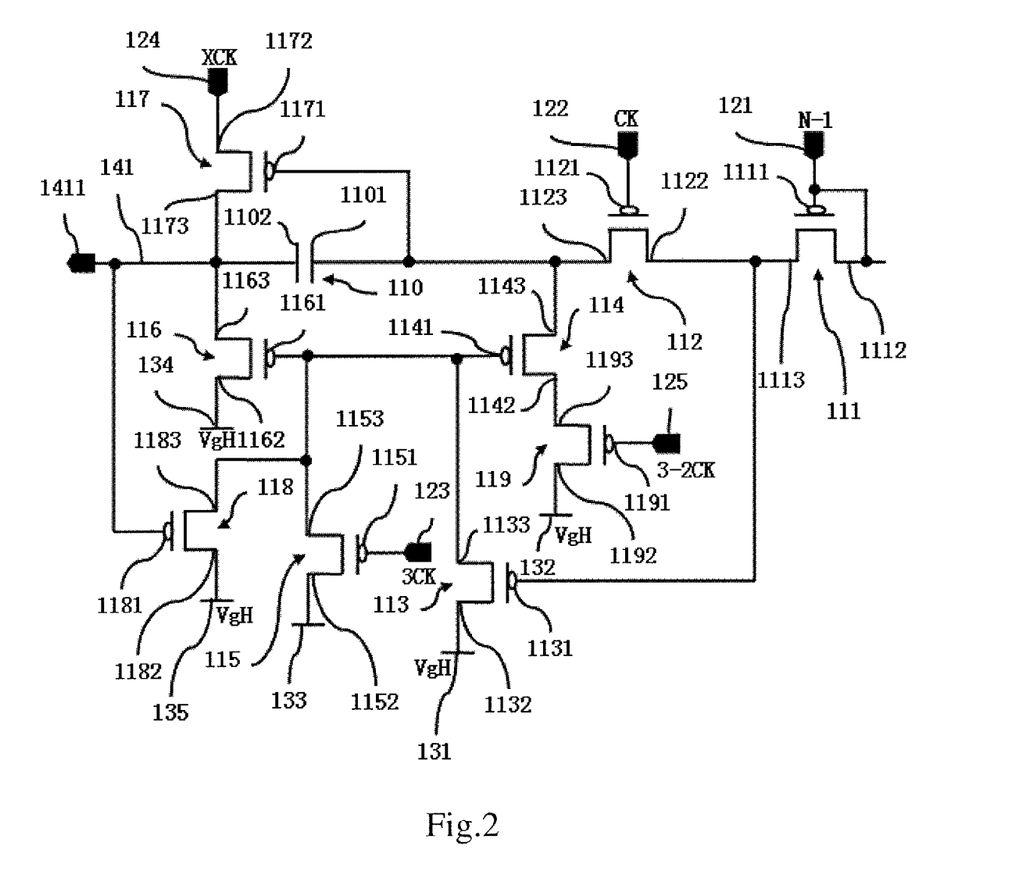
FIG. 2 is a view of a driving circuit of a display panel according to a second embodiment of the present invention.

FIG. 2 is a view of a driving circuit of a display panel according to a second embodiment of the present invention, and the difference between the second embodiment and the first embodiment is described below.

The driving circuit further comprises a seventh thin film transistor 119. The seventh thin film transistor 119 comprises a ninth gate electrode 1191, a ninth source electrode 1192, and a ninth drain electrode 1193, wherein the ninth gate electrode 1191 is configured to receive a fifth control signal 3-2CK from a fifth signal source 125, the ninth source electrode 1192 is configured to receive the second power source signal, the ninth drain electrode 1193 is connected to the fourth source electrode 1142, and the fourth source electrode 1142 receives the second power source signal through the ninth source electrode 1192 and the ninth drain electrode 1193. The seventh thin film transistor 119 is a ninth switch. The turning on or off of the seventh thin film transistor 119 corresponds to the turning on or off of a ninth current path between the ninth source electrode 1192 and the ninth drain electrode 1193.

In the embodiment, the seventh thin film transistor 119 is turned off during the second time period, so that the third power source signal can't be transmitted to the fourth source 1142 through the ninth source electrode 1192 and the ninth drain electrode 1193.

The first time period 301 is adjacent to the second time period 302, and the first time period 301 is prior to the second time period 302. The second time period 302 is the next time period and adjacent to the first time period 301.

When the first thin film transistor 111, the thin film transistor 112, the third thin film transistor 113, the fourth thin film transistor 114, the fifth thin film transistor 115, the reset thin film transistor 116, the output thin film transistor 117, and the sixth thin film transistor 118 are P-type thin film transistors in the second time period 302, the first control signal N-1 is a high level signal, the second control signal CK is a high level signal, the third control signal 3CK is a low level signal, the fourth control signal XCK is a high level signal, and the fifth control signal 3-2CK is a high level signal. When the first thin film transistor 111, the thin film transistor 112, the third thin film transistor 113, the fourth thin film transistor 114, the fifth thin film transistor 115, the reset thin film transistor 116, the output thin film transistor 117, and the sixth thin film transistor 118 are N-type thin film transistors in the second time period 302, the first control signal N-1 is a low level signal, the second control signal CK is a low level signal, the third control signal 3CK is a high level signal, the fourth control signal XCK is a low level signal, and the fifth control signal 3-2CK is a low level signal.

In the embodiment, the seventh thin film transistor 119 and fourth thin film transistor 114 work during the second time period 302 to prevent the second signal of a connected line between the fourth drain electrode 1143 and the second drain electrode 1123 from resetting.

In the embodiment, the output thin film transistor 117 is turned on during the second time period 302, and the output thin film transistor 117 and the reset thin film transistor 116 reset the first signal of the signal output line 141.

In the embodiment, the first width-to-length ratio of the output thin film transistor 117 is great, and the current is larger. Thus, the reset thin film transistor 116 quickly resets the output signal of the signal output line 141, and the time delay of the output signal is decreased. The width-to-length ratio of the reset thin film transistor 116 can be reduced to 10 micron/5 micron since the current of the output thin film transistor 117 is large. Therefore, the leakage of the reset thin film transistor 116 can be reduced, and the area of the GOA can be decreased.

Figure 5:
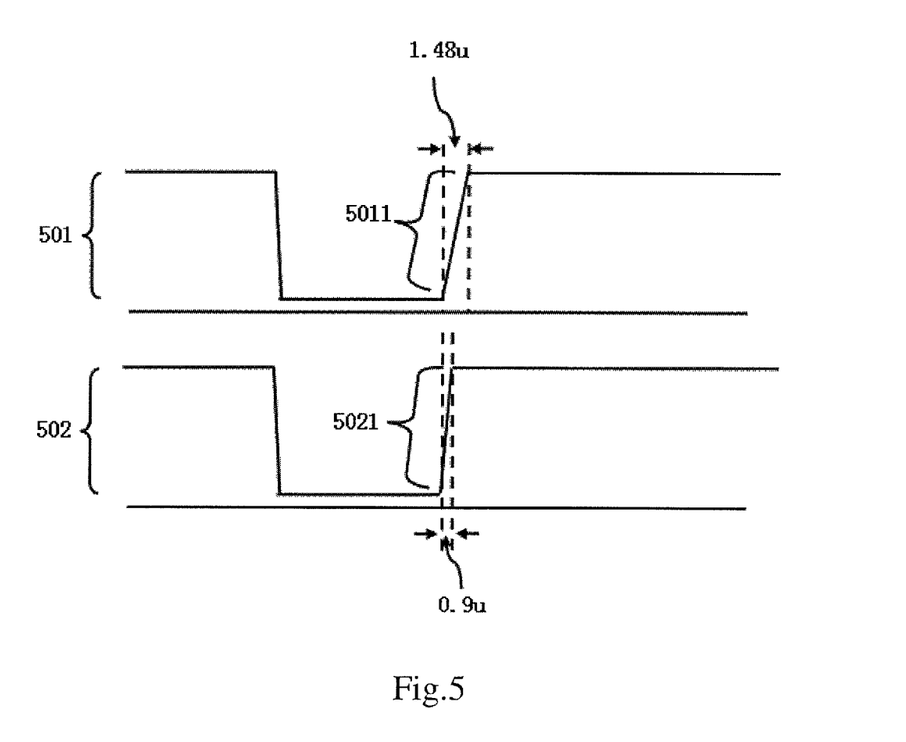
FIG. 5 is a view of the time delay of the portion of the output signal.

Referring to FIG. 5, a time delay of a portion 5011 of the output signal 501 is 1.48 u before improving it, and a time delay of an improved portion 5012 of the output signal 502 is 0.9 u (u=micron). The reduced rate of the the time delay between the portions is about 39.19%. Wherein values of the portions 5011, 5021 of the signals are increased for P-type thin film transistors, and values of the portions 5011, 5021 of the signals are decreased for N-type thin film transistors.

Figure 6:
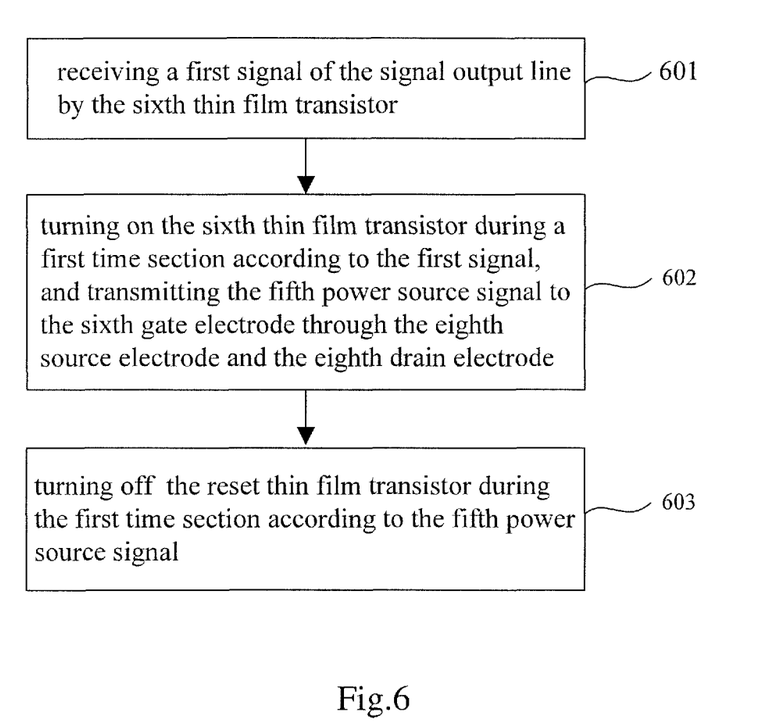
FIG. 6 is a flowchart of the driving method of the display panel according to the first embodiment of the present invention.

FIG. 6 is a flowchart of driving method of the display panel according to the first embodiment of the present invention. The driving method of the display panel of the present invention is implemented in the driving circuit of the display panel of FIGS. 1 and 2.

The method of the embodiment comprises the following steps.

In step 601, the sixth thin film transistor 118 is used to receive a first signal of the signal output line 141.

In step 602, the sixth thin film transistor 118 is turned on during a first time 301 period according to the first signal, and the fifth power source signal is transmitted to the sixth gate electrode 1161 through the eighth source electrode 1182 and the eighth drain electrode 1183 for turning off the reset thin film transistor 116 during the first time period 301.

In step 603, the reset thin film transistor 116 is turned off during the first time period 301 according to the fifth power source signal.

In the embodiment, the output signal of the signal line triggers the sixth thin film transistor 118 to be turned off during the first time period 301 (the signal output period of the signal output line), so that the fifth power source signal is outputted to the sixth gate electrode 1161, and the reset thin film transistor 116 is turned off during the first time period 301 to prevent the signal output line from draining. This also prevents the connected line between the fourth drain electrode and the second drain electrode from draining, and the signal output line 141 can stably output the output signal. In addition, the time delay of the output signal from the signal output line 141 can be reduced.

If the target output signal of the signal output line 141 is −7V (volts), the output signal 401 is −6.99V before improving, and the output signal 402 is −6.9999V after improving. Therefore, the output signal of the signal output line 141 according to above technical solutions is closer to the target.

Figure 7:
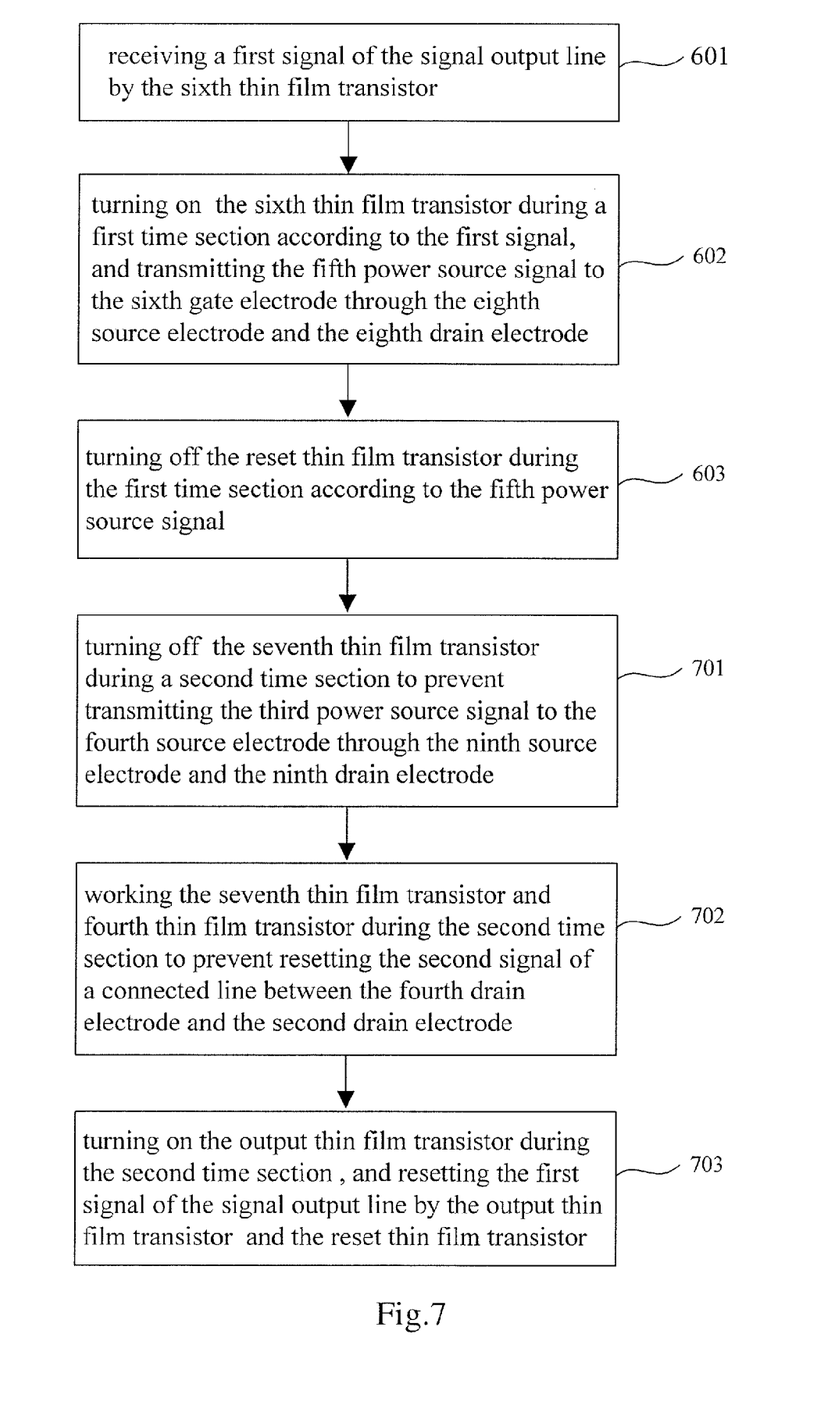
FIG. 7 is a flowchart of the driving method of the display panel according to the second embodiment of the present invention.

FIG. 7 is a flowchart of driving method of the display panel according to the second embodiment of the present invention, and the difference between FIG. 6 and FIG. 7 described below.

The method of the embodiment comprises the following steps.

In step 701, the seventh thin film transistor 119 is turned off during a second time period 302 to prevent transmitting the third power source signal to the fourth source electrode 1142 through the ninth source electrode 1192 and the ninth drain electrode 1193.

In step 702, the seventh thin film transistor 119 and fourth thin film transistor 114 are used during the second time period 302 to prevent resetting the second signal of a connected line between the fourth drain electrode 1143 and the second drain electrode 1123.

In step 703, the output thin film transistor 117 is turned on during the second time period 302, and the first signal of the signal output line 141 is reset by the output thin film transistor 117 and the reset thin film transistor 116.

In the embodiment, the first width-to-length ratio of the output thin film transistor 117 is increased, and the current is also increased. Thus, the reset thin film transistor 116 quickly resets the output signal of the signal output line 141, and the time delay of the reset portion of the output signal is decreased. The width-to-length ratio of the reset thin film transistor 116 can be reduced to 10 micron/5 micron since the current of the output thin film transistor 117 is large. Therefore, the leakage of the reset thin film transistor 116 can be reduced, and the area of the GOA can be decreased.

Referring to FIG. 5, the time delay of the portion 5011 of the output signal 501 is 1.48 u before improving, and the time delay of the portion 5012 of the output signal 502 is 0.9 u after improving (u=micron). The reduced rate of the time delay between the portions 5011 and 5012 is about 39.19%. Wherein values of the portions 5011, 5012 of the signals are increased for P-type thin film transistors, and values of the portions 5011, 5021 of the signals are decreased for N-type thin film transistors.

The present invention has been described with preferred embodiments thereof, and it is understood that many changes and modifications to the described embodiments can be carried out without departing from the scope and the spirit of the invention that is intended to be limited only by the appended claims.

What is claimed is:

1. A driving circuit of a display panel, comprising:

a capacitor comprising a first electrode plate and a second electrode plate wherein the second electrode plate is connected to a signal output line;

a first thin film transistor comprising a first gate electrode, a first source electrode, and a first drain electrode, wherein the first gate electrode is connected to the first source electrode, and the first gate electrode and the first source electrode are configured to receive a first control signal from a first signal source;

a second thin film transistor comprising a second gate electrode, a second source electrode, and a second drain electrode, wherein the first drain electrode is connected to the second source electrode and the second drain electrode is connected to the first electrode plate of the capacitor, and the second gate electrode is configured to receive a second control signal from a second signal source;

a third thin film transistor comprising a third gate electrode, a third source electrode, and a third drain electrode, wherein the third gate electrode is connected to the first drain electrode, and the third drain electrode is configured to receive a first power source signal;

a fourth thin film transistor comprising a fourth gate electrode, a fourth source electrode, and a fourth drain electrode, wherein the fourth gate electrode is connected to the third drain electrode, the fourth source electrode is configured to receive a second power source signal, and the fourth drain electrode is connected to the second drain electrode;

a fifth thin film transistor comprising a fifth gate electrode, a fifth source electrode, and a fifth drain electrode, wherein the fifth gate electrode is configured to receive a third control signal from a third signal source, the fifth drain electrode is connected to the third drain electrode, and the fifth source electrode is configured to receive a third power source signal;

a reset thin film transistor comprising a sixth gate electrode, a sixth source electrode, and a sixth drain electrode, wherein the sixth gate electrode is connected to the fifth drain electrode, the sixth drain electrode is connected to the signal output line, and the sixth source electrode is configured to receive a fourth power source signal;

an output thin film transistor comprising a seventh gate electrode, a seventh source electrode, and a seventh drain electrode, wherein the seventh source electrode is configured to receive a fourth control signal from a fourth signal source, the seven gate electrode is connected to the second drain electrode, and the seventh drain electrode is connected to the signal output line;

a sixth thin film transistor comprising an eighth gate electrode, an eighth source electrode, and an eighth drain electrode, wherein the eighth gate electrode is connected to the signal output line, the eighth source electrode is configured to receive a fifth power source signal, and the eighth drain electrode is connected to the sixth gate electrode; and a seventh thin film transistor comprising a ninth gate electrode, a ninth source electrode, and a ninth drain electrode, wherein the ninth gate electrode is configured receive a fifth control signal from a fifth signal source, the ninth source electrode is configured to receive the second power source signal, and the ninth drain electrode is connected to the fourth source electrode;

wherein the output thin film transistor comprises a first width-to-length ratio, and the reset thin film transistor comprises a second width-to-length ratio, and the first width-to-length ratio is greater than the second width-to-length ratio.

2. The driving circuit of the display panel according to claim 1, wherein the sixth thin film transistor is configured to receive a first signal of the signal output line and turned on during a first time period according to the first signal, so that the fifth power source signal is transmitted to the sixth gate electrode through the eighth source electrode and the eighth drain electrode for turning off the reset thin film transistor during the first time period; the reset thin film transistor is turned off during the first time period according to the fifth power source signal.

3. The driving circuit of the display panel according to claim 1, wherein the seventh thin film transistor is turned off during a second time period to prevent the third power source signal from being transmitted to the fourth source electrode through the ninth source electrode and the ninth drain electrode.

4. The driving circuit of the display panel according to claim 3, wherein the seventh thin film transistor and fourth thin film transistor work during the second time period to prevent the second signal of a connected line between the fourth drain electrode and the second drain electrode reset.

5. The driving circuit of the display panel according to claim 3, wherein the output thin film transistor is turned on during the second time period, and the output thin film transistor and the reset thin film transistor reset the first signal of the signal output line.

6. The driving circuit of the display panel according to claim 3, wherein the first time period corresponds to a signal output period of the signal output line, the first time period is adjacent to the second time period, and the first time period is prior to the second time period.

7. The driving circuit of the display panel according to claim 3, wherein the first control signal is a scanning signal so that the current row of pixels corresponds to the prior row of pixels.

* * * * *